United States Patent
Lasser

(10) Patent No.: US 7,603,525 B2
(45) Date of Patent: *Oct. 13, 2009

(54) FLASH MEMORY MANAGEMENT METHOD THAT IS RESISTANT TO DATA CORRUPTION BY POWER LOSS

(75) Inventor: Menahem Lasser, Kohav Yair (IL)

(73) Assignee: Sandisk IL Ltd., Kfar Saba (IL)

( * ) Notice: Subject to any disclaimer, the term of this patent is extended or adjusted under 35 U.S.C. 154(b) by 597 days.

This patent is subject to a terminal disclaimer.

(21) Appl. No.: 11/159,170

(22) Filed: Jun. 23, 2005

(65) Prior Publication Data

US 2005/0240721 A1 Oct. 27, 2005

Related U.S. Application Data

(63) Continuation of application No. 10/608,189, filed on Jun. 30, 2003, now Pat. No. 6,988,175.

(51) Int. Cl.
*G06F 13/00* (2006.01)
*G06F 13/28* (2006.01)

(52) U.S. Cl. .................................. 711/154; 711/103
(58) Field of Classification Search .............. None
See application file for complete search history.

(56) References Cited

U.S. PATENT DOCUMENTS

| 5,737,231 A | 4/1998 | Pyle et al. |
| 6,773,083 B2 | 8/2004 | Fields et al. |
| 6,834,331 B1 | 12/2004 | Liu |
| 2003/0137888 A1* | 7/2003 | Chen et al. ............. 365/200 |

* cited by examiner

*Primary Examiner*—Kevin Verbrugge
*Assistant Examiner*—Eric S Cardwell
(74) *Attorney, Agent, or Firm*—Toler Law Group

(57) ABSTRACT

A method for managing page-based data storage media such as flash media, a system that uses that method, and a computer-readable storage medium bearing code for implementing the method. New data are written to the storage medium in a manner that precludes corruption of old data if the writing of the new data is interrupted. Specifically, risk zones are defined, by identifying, for each page, the other pages whose data are put at risk of corruption if writing to the page is interrupted. A page, that otherwise would be the target of a write operation, is not written if any of the pages in its risk zone contain data that could be corrupted if the write operation is interrupted.

15 Claims, 10 Drawing Sheets

| 0 | PAGE 32 |
|---|---|
| 1 | PAGE 32 |
| 2 | PAGE 32 |
| 3 | PAGE 32 |
| 4 | PAGE 32 |
| 5 | PAGE 32 |
| 6 | PAGE 32 |
| 7 | PAGE 32 |
| 8 | PAGE 32 |
| 9 | PAGE 32 |
| 10 | PAGE 32 |
| 11 | PAGE 32 |
| 12 | PAGE 32 |
| 13 | PAGE 32 |
| 14 | PAGE 32 |
| 15 | PAGE 32 |
| 16 | PAGE 32 |
| 17 | PAGE 32 |
| 18 | PAGE 32 |
| 19 | PAGE 32 |
| 20 | PAGE 32 |
| 21 | PAGE 32 |
| 22 | PAGE 32 |
| 23 | PAGE 32 |
| 24 | PAGE 32 |
| 25 | PAGE 32 |
| 26 | PAGE 32 |
| 27 | PAGE 32 |
| 28 | PAGE 32 |
| 29 | PAGE 32 |
| 30 | PAGE 32 |
| 31 | PAGE 32 |
| 32 | PAGE 32 |
| 33 | PAGE 32 |
| 34 | PAGE 32 |
| 35 | PAGE 32 |
| 36 | PAGE 32 |
| 37 | PAGE 32 |
| 38 | PAGE 32 |
| 39 | PAGE 32 |
| 40 | PAGE 32 |
| 41 | PAGE 32 |
| 42 | PAGE 32 |
| 43 | PAGE 32 |
| 44 | PAGE 32 |
| 45 | PAGE 32 |
| 46 | PAGE 32 |
| 47 | PAGE 32 |
| 48 | PAGE 32 |
| 49 | PAGE 32 |
| 50 | PAGE 32 |
| 51 | PAGE 32 |
| 52 | PAGE 32 |
| 53 | PAGE 32 |
| 54 | PAGE 32 |
| 55 | PAGE 32 |
| 56 | PAGE 32 |
| 57 | PAGE 32 |
| 58 | PAGE 32 |
| 59 | PAGE 32 |
| 60 | PAGE 32 |
| 61 | PAGE 32 |
| 62 | PAGE 32 |
| 63 | PAGE 32 |

FIGURE 2 (PRIOR ART)

| | | |
|---|---|---|
| 0 | PAGE 32 | } 34 |
| 4 | PAGE 32 | |
| 1 | PAGE 32 | } 34 |
| 5 | PAGE 32 | |
| 2 | PAGE 32 | } 34 |
| 6 | PAGE 32 | |
| 3 | PAGE 32 | } 34 |
| 7 | PAGE 32 | |
| 8 | PAGE 32 | } 34 |
| 12 | PAGE 32 | |
| 9 | PAGE 32 | } 34 |
| 13 | PAGE 32 | |
| 10 | PAGE 32 | } 34 |
| 14 | PAGE 32 | |
| 11 | PAGE 32 | } 34 |
| 15 | PAGE 32 | |
| 16 | PAGE 32 | } 34 |
| 20 | PAGE 32 | |
| 17 | PAGE 32 | } 34 |
| 21 | PAGE 32 | |
| 18 | PAGE 32 | } 34 |
| 22 | PAGE 32 | |
| 19 | PAGE 32 | } 34 |
| 23 | PAGE 32 | |
| 24 | PAGE 32 | } 34 |
| 28 | PAGE 32 | |
| 25 | PAGE 32 | } 34 |
| 29 | PAGE 32 | |
| 26 | PAGE 32 | } 34 |
| 30 | PAGE 32 | |
| 27 | PAGE 32 | } 34 |
| 31 | PAGE 32 | |
| 32 | PAGE 32 | } 34 |
| 36 | PAGE 32 | |
| 33 | PAGE 32 | } 34 |
| 37 | PAGE 32 | |
| 34 | PAGE 32 | } 34 |
| 38 | PAGE 32 | |
| 35 | PAGE 32 | } 34 |
| 39 | PAGE 32 | |
| 40 | PAGE 32 | } 34 |
| 44 | PAGE 32 | |
| 41 | PAGE 32 | } 34 |
| 45 | PAGE 32 | |
| 42 | PAGE 32 | } 34 |
| 46 | PAGE 32 | |
| 43 | PAGE 32 | } 34 |
| 47 | PAGE 32 | |
| 48 | PAGE 32 | } 34 |
| 52 | PAGE 32 | |
| 49 | PAGE 32 | } 34 |
| 53 | PAGE 32 | |
| 50 | PAGE 32 | } 34 |
| 54 | PAGE 32 | |
| 51 | PAGE 32 | } 34 |
| 55 | PAGE 32 | |
| 56 | PAGE 32 | } 34 |
| 60 | PAGE 32 | |
| 57 | PAGE 32 | } 34 |
| 61 | PAGE 32 | |
| 58 | PAGE 32 | } 34 |
| 62 | PAGE 32 | |
| 59 | PAGE 32 | } 34 |
| 63 | PAGE 32 | |

| address | status |
|---|---|
| 0 | page 32 written |
| 1 | page 32 unwritten |
| 2 | page 32 written |
| 3 | page 32 written |

FIGURE 4C

| address | status |
|---|---|
| 0 | page 32 deleted |
| 1 | page 32 deleted |
| 2 | page 32 written |
| 3 | page 32 written |

FIGURE 4D

FLASH MEMORY MANAGEMENT METHOD THAT IS RESISTANT TO DATA CORRUPTION BY POWER LOSS

This is a Continuation of currently patent application Ser. No. 10/608,189 filed Jun. 30, 2003 now U.S. Pat. No. 6,988, 175.

FIELD AND BACKGROUND OF THE INVENTION

The present invention relates to a method of managing a flash memory and, more particularly, to a method, of managing a multi-level cell flash memory, that is resistant to data corruption when power is interrupted unexpectedly.

Flash memory is a form of EEPROM (electronically erasable programmable read-only memory) non-volatile memory. FIG. 1A is a high level schematic block diagram of a generic flash-based data storage device 10 that is used by a host device (not shown) for storing data in one or more NAND flash media 12. The operation of device 10 is controlled by a microprocessor-based controller 14 with the help of a random access memory (RAM) 16 and an auxiliary non-volatile memory 18. For this purpose, flash device 10 and the host system communicate via a communication port 20 in flash device 10. Typically, for backwards compatibility with host devices whose operating systems are oriented towards block memory devices such as magnetic hard disks, flash device 10 emulates a block memory device, using firmware stored in auxiliary non-volatile memory 18 that implements flash management methods such as those taught by Ban in U.S. Pat. Nos. 5,404,485 and 5,937,425, both of which patents are incorporated by reference for all purposes as if fully set forth herein. The components of device 10 are housed together in a common housing 15.

Other devices that use NAND flash media to store data are known. FIG. 1B shows a personal computer 10' in which NAND flash media 12 are used in addition to, or as a substitute for, a magnetic hard disk for long-term non-volatile data storage. Controller 14 now represents the central processing unit of personal computer 10'. Auxiliary non-volatile memory 18 now represents all of the other non-volatile memories of personal computer 10', including a BIOS in which boot code is stored and a magnetic hard disk for storing the operating system, including the flash management system, of personal computer 10' (unless NAND flash media 12 are a substitute for a magnetic hard disk, in which case the operating system is stored in NAND flash media 12). NAND flash media 12, controller 14, RAM 16, auxiliary non-volatile memory 18 and other components (not shown) of personal computer 10' communicate with each other via a bus 19. In some configurations of personal computer 10', NAND flash media 12 are on a removable card. In other configurations of personal computer 10', the illustrated components are integrated in a single unitary physical device, so that NAND flash media 12 are not a physically separate entity.

The operations that controller 14 performs on NAND flash media 12 include read operations, write operations and erase operations. NAND Flash media 12 typically are written in units called "pages", each of which typically includes between 512 bytes and 2048 bytes, and typically are erased in units called "blocks", each of which typically includes between 16 and 64 pages. Note that the use of the word "block" to refer to the erasable units of NAND flash media 12 should not be confused with the use of the word "block" in the term "block memory device". The "block" nature of a block memory device refers to the fact that the device driver exports an interface that exchanges data only in units that are integral multiples of a fixed-size unit that typically is called a "sector".

To facilitate the management of NAND flash media 12, controller 14 assigns each page a status of "unwritten" or "written". A page whose status is "unwritten" is a page that has not been written since the last time it was erased, and so is available for writing. A page whose status is "written" is a page to which data have been written and not yet erased. In some embodiments of device 10, controller 14 also assigns some pages a status of "deleted". A page whose status is "deleted" is a page that contains invalid (typically superseded or out of date) data. In embodiments of device 10 that support "deleted" pages, the "written" status is reserved for pages that contain valid data. Herein, a page whose status is "unwritten" is called an "unwritten page", a page whose status is "written" is called a "written page" and a page whose status is "deleted" is called a "deleted page".

Because device 10 is used for non-volatile data storage, it is vital that device 10 retain the data written thereto under all circumstances. A major risk to the integrity of data stored in device 10 is a sudden power failure in which the power source to device 10 is interrupted with no prior notice while device 10 is in the middle of an operation. Often such a power failure causes the interrupted operation to have erratic or unpredictable results.

If the power failure occurs while device 10 is in the middle of an operation that changes the contents of NAND flash media 12, for example in the middle of writing a page of data or in the middle of erasing a block, the contents of the interrupted page or block are unpredictable after device 10 has been powered up again and indeed may be random. This is because some of the affected bits may have gotten to the state assigned to them by the operation by the time power was interrupted, while other bits were lagging behind and not yet at their target values. Furthermore, some bits might be caught in intermediate states, and thus be in an unreliable mode in which reading these bits will return different results in different read operations.

This problem is handled well by many prior art flash management software systems, for example the TrueFFS flash management system used by M-Systems Flash Disk Pioneers Ltd. of Kfar Saba, Israel. The reason that these prior art systems can defend against this problem is that the data corruption is localized to the page or block being modified when the power failure occurs. All the other pages in NAND flash media 12 keep their contents and do not become corrupted. Therefore, in the case of an interrupted write operation, prior art flash management systems can assume the validity of all other pages and concentrate on the last page written. There are several approaches that can be used.

One approach is to store a pointer, to the page to be written or to the block to be erased, in a predetermined location before the operation, so that when device 10 powers up again, controller 14 can look up this pointer and immediately know which page or block was the last one targeted. This method usually uses one or more validity flags that signal to controller 14 whether the operation completed successfully. See for example co-pending US Published Patent Application No. 2003/0099134, which is incorporated by reference for all purposes as if fully set forth herein. That patent application teaches an example of such a method for protecting against power loss during erasing.

Another approach is to limit the locations where data may be written at any given time to only a subset of the pages. Controller 14 then can consider all such locations as potentially corrupt, and can avoid using the data stored therein upon powering up. Alternatively, controller 14 can subject the data to a "validity test" before trusting them as not corrupted. An example of a flash management method to which this approach can be applied is taught in published PCT Application WO 03/030180, which is incorporated by reference for all purposes as if fully set forth herein. According to that patent application, the writing algorithm is limited to writing new pages in sequential order within each block. Therefore, on power up it is known that the last page written in any given block was the highest numbered written page in that block.

Other systems are not amenable to such shortcuts, and a brute force method of identifying suspect pages might be used. Nevertheless, the handling of the power-loss data corruption problem is made relatively easy by the knowledge that only the data in the last written page might have been corrupted and that the data stored in all the other pages are reliable.

It should be pointed out that the above discussion applies to the validity of pages as stand-alone entities. It is another question altogether whether the system as a whole is valid even if no page write was interrupted. Such problems can occur, for example, in file systems in which a user-level operation consists of several page-level operations. For example, the creation of a new file involves writing a directory entry, writing one or more sector allocation tables and only then writing the actual file data. If only some of these write operations are completed by the time power fails, while the remaining write operations have yet to begin, then no page is corrupted but the file system as a whole is corrupted. Methods for protecting against such problems are known (see for example co-pending US Published Patent Application No. 2004/0193564) but are beyond the scope of the present invention.

Recently, NAND flash media 12 have come into use for which the above assumptions about the locality of data corruption upon power loss are not valid. Examples of such NAND flash media 12 include the Multi-Level Cell (MLC) NAND flash devices of Toshiba (e.g. the TC58DVG04B1FT00). In such devices, each cell stores two bits rather than one bit. The internal arrangement of that device is such that a physical page resides within a group of 528×8=4224 cells. But while in other devices such a group of cells stores one page of 528 bytes, in the Toshiba MLC NAND flash devices such a group of cells stores two such pages of data. Such a group of cells, that stores two or more pages of data, is called a "superpage" herein.

FIG. 2 is a schematic illustration of a block 30 of one such MLC NAND flash device. Block 30 includes 64 pages 32, with respective logical addresses 0 through 63, in 32 superpages 34. The logical addresses of pages 32 are shown in FIG. 2 in a column on the left side of block 30.

Now consider the following sequence of events:

1. One of the pages 32 of a two-page superpage 34 is written successfully, with the other page not being written.

2. A write to the other page 32 of the two-page superpage 34 is interrupted by a power loss.

Because the two pages 32 of this superpage 34 share the same physical cells, the power loss could corrupt both pages 32. To understand how both pages 32 could be corrupted it is necessary to consider how bits are encoded within an MLC flash cell. One method of encoding bits in MLC flash cells is taught by Harari in U.S. Pat. No. 5,095,344 and in U.S. Pat. No. 5,043,940. According to this method, bits are encoded in a MLC flash cell by injecting different amounts of electrical charge into the floating gate of a flash cell, thereby producing different levels of a threshold voltage $V_{T1}$ of the cell. The following table shows the values of the two bits stored in the cell as a function of threshold voltage:

| $V_{T1}$ | Value of bit 1 | Value of bit 2 |
|---|---|---|
| −3.0 V | 1 | 1 |
| −0.5 V | 1 | 0 |
| +2.0 V | 0 | 1 |
| +4.5 V | 0 | 0 |

In practice, the four possible bit combinations of a two-bit flash cell are stored as four different threshold voltage ranges. In the above example, the threshold voltage ranges are +3.25V to +5.75V for (0,0), +0.75V to +3.25V for (0,1), −1.75V to +0.75V for (1,0) and −4.25V to −1.75V for (1,1). FIG. 6 shows these voltage ranges on the abscissa of a histogram of the threshold voltages of a MLC flash memory: because the cells in a flash device are not exactly identical in their characteristics and behavior (due, for example, to small variations in impurities concentrations or to defects in the silicon structure), encoding the same bit pattern in all the cells does not cause all of the cells to have exactly the same threshold voltage. Each peak of the histogram is labeled with the corresponding bit pattern. Because changing either one of the two bits involves changing the same physical attribute (i.e., the threshold voltage) of the cell, it is clear that the process of changing one bit shifts the other bit from its previously stable state. If the change does not complete correctly, it might result in a wrong interpretation for the value of either or both bits.

The true difficulty in defending against this problem arises because the two pages 32 of a superpage 34 might be written at two different, widely separated times. Conceivably, a first page 32 of a superpage 34, that was written at a certain time, could be corrupted many years later by an incomplete write to the second page 32 of that superpage 34. Moreover, most file systems that sit on top of flash management systems may allocate pages 32 to files either contiguously or noncontiguously, so that pages 32 of the same superpage 34 could belong to totally unrelated files. A power loss during the update of one file could corrupt a totally unrelated file that would not be suspected of being at risk. Obviously, these conditions are beyond the capability of prior art flash management systems to deal with.

There is thus a widely recognized need for, and it would be highly advantageous to have, a flash management system capable of dealing with power interruptions to NAND flash media 12 that are based on multi-level cells.

SUMMARY OF THE INVENTION

According to the present invention there is provided a method of managing a memory that includes a plurality of pages, the method including the steps of: (a) for each page: identifying a respective risk zone; (b) selecting at least one unwritten page for writing new data; and (c) writing the new data to the at least one unwritten page only if, for each at least one unwritten page, the risk zone of the each at least one unwritten page lacks written pages.

According to the present invention there is provided a data storage system, including: (a) a data storage medium including a plurality of pages; and (b) a controller for writing new data to the pages in a manner that precludes corruption of old data stored in a first page if writing the new data to a second page is interrupted.

According to the present invention there is provided a computer readable storage medium having computer readable code embodied on the computer readable storage medium, the computer readable code for writing new data to at least one of a plurality of pages of a data storage medium in a manner that precludes corruption of old data stored in a the page if writing the new data to a the page is interrupted.

The method of the present invention is a method of managing a memory, such as NAND flash media 12, that includes a plurality of pages. At a minimum, the flash management system to which the method of the present invention applies must support "unwritten" and "written" statuses for the pages.

The present invention is based on defining "risk zones" of pages whose data could be corrupted by interrupted writes. When one or more pages are selected for writing new data, the risk zone(s) of the page(s) selected for that write operation is/are checked to see if any of the other pages in that/those risk zone(s) might be storing valid data, i.e., if the status of any of the other pages in that/those risk zone(s) is "written". If any of the other pages in that/those risk zone(s) might in fact be storing valid data, then the selected page(s) is/are not written. Instead, the flash management system seeks a different page or pages for the write operation.

The risk zone of a page is defined herein as the set of other pages whose data are placed at risk of corruption when the page is written. For example, in FIG. 2, the risk zone of each page 32 is the other page 32 of that page 32's superpage 34. When one or more unwritten pages are selected for writing, the selected page or pages are written only if there are no written pages in any of their risk zones.

Preferably, if the data to be written span more than one page, the selected pages are written substantially simultaneously.

Preferably, if the risk zone of one of the selected pages includes one or more written pages, a different unwritten page is substituted for that selected page. This substitution is continued until none of the risk zones of the selected pages include written pages and all of the new data are written.

Preferably, if the selected risk zone(s) include(s) one or more written pages, so that the selected pages are not written, the flash management system seeks another, second set of unwritten pages that is large enough to accommodate both the new data and the written page(s) of the originally selected risk zone(s). If the second set of unwritten pages lacks written pages of its own, then the written page(s) of the originally selected risk zone(s) are copied to the second set of pages, and the new data are written to the second set of pages. Finally, in a flash management system that supports the "deleted" status, the written page(s) of the originally selected risk zone(s) is/are marked as deleted. Most preferably, the copying of the written pages to the second set of unwritten pages and the writing of the new data to the second set of unwritten pages are effected substantially simultaneously.

Alternatively, in a flash management system that supports the "deleted" status, if the selected pages are in fact written, the pages of the targeted risk zone(s) that are not written are marked as deleted.

Optionally, all the risk zones have equal numbers of pages. For example, to manage NAND flash media 12 that include blocks such as block 30, each risk zone includes one page 32. Alternatively, some of the risk zones have different numbers of pages. In fact, it is not even necessary that every risk zone include any pages at all.

Optionally, each page, along with the pages of its risk zone, form a contiguous set of pages. Alternatively, each page along with the pages of its risk zone, may constitute a set of pages that includes discontiguous pages, i.e., a set of pages, at least some of whose logical addresses are not consecutive.

If the data to be written span more than one page, the targeted pages may be written either sequentially or in a random order. "Sequential" writing means that the pages of a block are written only in increasing logical address order, as in WO 03/030180. "Random" writing means that the pages of a block may be written in any logical address order.

The system of the present invention includes a data storage medium that includes a plurality of pages and a controller for writing new data to the pages in a manner that precludes corruption of old data stored in a previously written page if writing the new data to another one of the pages is interrupted before the writing is completed. Preferably, the controller does this by implementing the method of the present invention.

In some embodiments of the system of the present invention, the data storage medium and the controller are operationally associated together within a common housing, such as housing 15 of prior art device 10. In other embodiments of the system of the present invention, the data storage medium and the controller are housed in separate devices and the operational association of the data storage medium and the controller is reversible. For example, the data storage medium may be the flash memory of a flash memory device that is reversibly mounted on a host device, and the controller may be the central processing unit of the host device.

Preferably, the data storage medium is a non-volatile data storage medium, for example a flash memory. Most preferably, the data storage medium is a flash memory with multi-level cells.

If the data storage medium is a flash memory that includes a plurality of blocks, each of which blocks includes a subplurality of the pages, then preferably the controller is operative to write the data to the pages of each block only sequentially. Alternatively, the controller is operative to write the data to the pages of each block in a random order.

The scope of the present invention also includes a computer readable storage medium in which is embodied computer readable code for writing new data to the pages of a data storage medium in a manner that precludes corruption of old data already stored in the pages of the data storage medium if the writing of the new data is interrupted.

BRIEF DESCRIPTION OF THE DRAWINGS

The invention is herein described, by way of example only, with reference to the accompanying drawings, wherein:

FIGS. 2 and 3 are schematic illustrations of two different embodiments of a block of a multi-level-cell flash memory;

FIGS. 4A-4D present an example of writing data to the block of FIG. 2 according to the present invention;

DESCRIPTION OF THE PREFERRED EMBODIMENTS

Figure 1A:
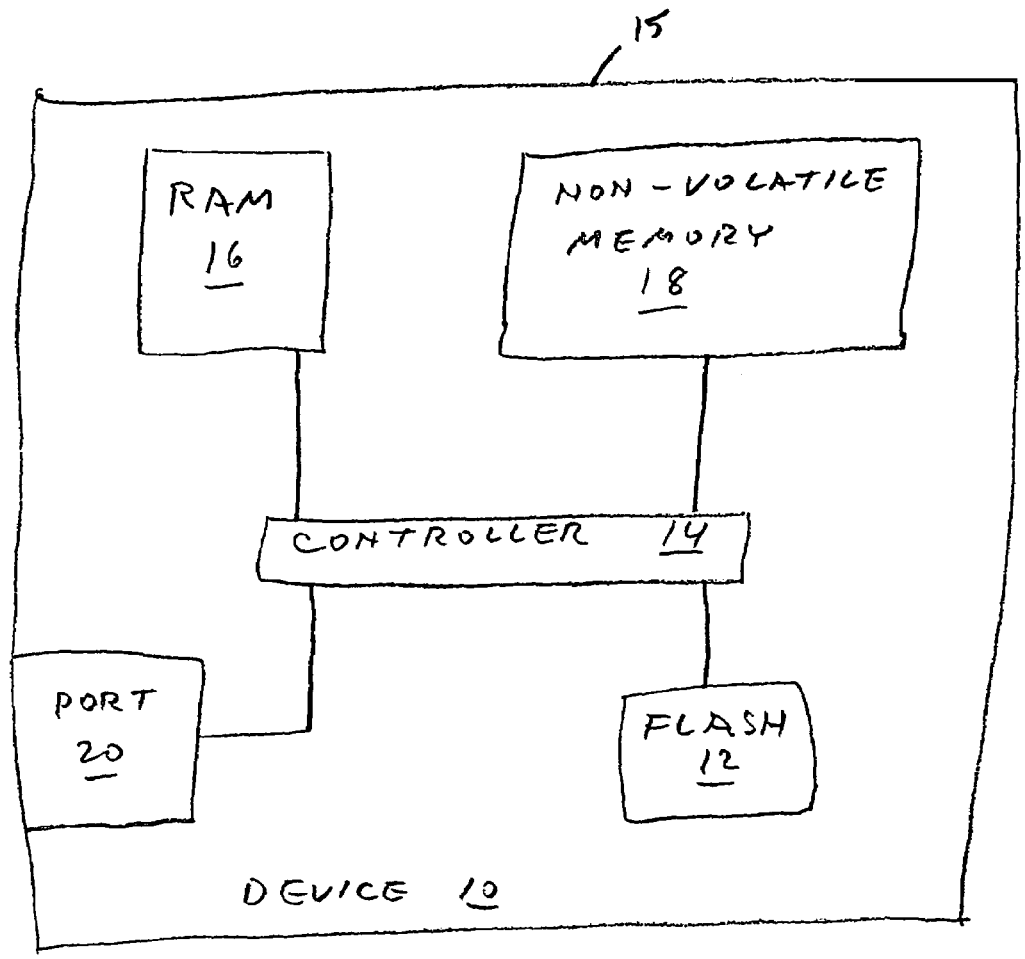
FIGS. 1A and 1B are high level schematic block diagrams of prior art devices that use NAND flash media for non-volatile data storage.

The present invention is of a method of managing a page-based memory so as to prevent the corruption of data in previously written pages by an interrupted write operation. Specifically, the present invention can be used to manage flash memories with multi-level cells.

The principles and operation of memory management according to the present invention may be better understood with reference to the drawings and the accompanying description.

As noted above, the present invention is based on defining "risk zones" of pages that could be corrupted by interrupted writes. When a page is selected for writing new data, the risk zone(s) of the page(s) selected for that write operation is/are checked to see if any of the other pages in that/those risk zone(s) already store data, i.e., if the status of any of the other pages in that/those risk zone(s) is "written". Note that in a flash management system that supports the "deleted" status, this check actually is only for pages in the risk zone(s) that store valid data. If any of the other pages in that/those risk zone(s) do in fact store (valid) data, then the selected page(s) is/are not written. Instead, the flash management system seeks a different page or pages for the write operation.

As noted above, the risk zone of a page is defined as the set of other pages whose data are placed at risk of corruption when the page is written. For example, in block 30, the two pages 32 of each superpage 34 have adjacent addresses that differ only in their least significant bit. The risk zone of each page 32 is the other page 32 of that page 32's superpage 34. Because the addresses of pages 32 are consecutive, starting from zero, as shown in the left hand column of FIG. 2, the risk zone of a page 32 with an even address is the next page 32, and the risk zone of a page 32 with an odd address is the preceding page 32.

In the example of FIG. 2, the risk zone of each page 32 is a page 32 whose address differs by 1. This arrangement is not obligatory. A chip designer is free to design flash memories in which pages that share flash cells do not have adjacent addresses.

The exemplary flash memories considered herein, such as the Toshiba TC58DVG04B1FT00, allow only sequential writing of pages within a block. In the context of exemplary block 30 of FIG. 2, this means that it is forbidden to write a page 32 that has an odd address and then to write the preceding even-addressed page 32. In the examples presented herein, it is assumed that writing always proceeds from low page addresses to high page addresses. Nevertheless, those skilled in the art will appreciate that the present invention is fully applicable to flash memories in which writing is allowed only in the opposite direction (high address to low address) or in either direction.

What is to be avoided is writing to a page whose risk zone includes a written page. In the case of a write command that directs the flash management system to write more than one page, this condition is tested for the targeted pages before the write command is executed. So, for example, in writing two pages worth of data to block 30 at the behest of a single write command, the flash management system is free to write first to an even-addressed page 32 (for example page 32 at address 0) and then to the immediately following page 32 (for example page 32 at address 1) even though, by the time data are written to the second page 32, the risk zone of the second page 32 includes a written page 32. This is allowed because the two pages 32 that are written by the same command are logically related, so that the flash management system is capable of defending against corruption of the first written page 32 by an interrupted write of the second written page 32. Such a case is quite different from the far more difficult case of pages 32 at arbitrary locations or pages 32 that are written at arbitrary times being put at risk. Writing of multiple pages as the result of a single command is considered herein to be "simultaneous" writing of these pages.

When the default algorithm of the flash management system selects, for writing, a page 32 whose writing is forbidden according to the above criteria, the flash management system considers this page 32 to be unavailable and selects instead a different page 32 for writing. Optionally, in a flash management system that supports the "deleted" status, the unavailable page 32 is marked as deleted, to reflect the fact that it is unavailable. For example, under the sequentially writing flash management method of WO 03/030180, as applied to block 30, if the default algorithm selects a page 32 with an odd address, such that the page 32 with the immediately preceding (even) address is a written page 32, writing is directed to the next available page 32, i.e., the page 32 with the immediately succeeding (even) address, thus leaving a "gap" of an unused page 32 in the middle of block 30. So a command to write one page worth of data to a page 32 with an even address makes the page 32 with the immediately succeeding odd address unavailable for writing (but only until this block 30 is erased and all of its pages 32 are rendered "unwritten" by the flash management system's block reclamation mechanism).

If it is desired to avoid such gaps, the flash management system finds enough unwritten space both to write the new data and to copy the pages 32 that would have been put at risk by the default algorithm. In the context of the above example of the WO 03/030180 flash management method, the written page 32 at the even address immediately preceding the initially targeted page 32 is copied to the page 32 at the immediately succeeding address, the new data are written to the page 32 at the immediately succeeding odd address. Optionally, in a flash management system that supports the "deleted" status, the written page 32 at the even address immediately preceding the initially targeted page 32 is marked "deleted", and the initially targeted page 32 also is marked "deleted". For example, if the only written page 32 in block 30 is page 32 at address 0, so that the default algorithm targets page 32 at address 1 for writing because page 32 at address 1 is the first unwritten page 32 in block 30, then page 32 at address 0 is copied to page 32 at address 2, and the new data are written to page 32 at address 3. Optionally, the pages 32 at addresses 0 and 1 then are marked "deleted".

FIGS. 4A-4D show this process in detail.

Figure 4A:
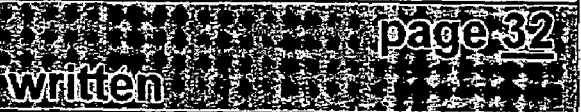

FIG. 4A shows the initial status of the first four pages 32 of block 30 when the write command is received. The page 32 at address 0 is indicated as "written". The other three pages are "unwritten. The default target of the write command is the page 32 at address 1. This default command places the page 32 at address 0 at risk, as indicated by the shading of the page 32 at address 0.

Figure 4B:
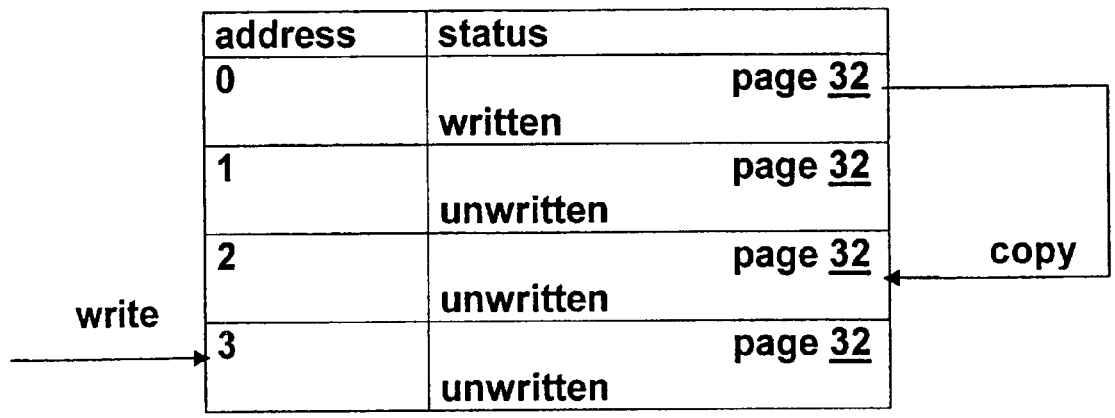

FIG. 4B shows how the present invention writes the new data without putting the data at address 0 at risk. The data at address 0 are copied to the page 32 at address 2. The new data are written to the page 32 at address 3.

FIG. 4C shows the status of the first four pages 32 of block 30 after the write operation of the present invention. The pages 32 at addresses 0, 2 and 3 are "written". It does not matter if the data written to the page 32 at address 0 subsequently are corrupted because these data have been copied to the page 32 at address 2. FIG. 4D shows the status of the first four pages 32 of block 30 after the optional marking of the pages 32 at addresses 0 and 1 as "deleted".

Note that the flash management system of WO 03/030180 is cited herein as only an example of a flash management system in which the method of the present invention can be included naturally and conveniently. The method of the present invention is applicable to any flash management system.

So far, the present invention has been discussed in terms of flash media 12 that have risk zones because their cells store more than one bit each. There also are flash architectures in which single-bit cells put each other's bits at risk. Consider, for example, four flash memories, with 512-byte physical pages, connected in parallel, and with 512-byte logical pages that span the four flash memories as follows:

The logical page numbered 4n includes bytes 0 through 127 of the four physical pages numbered n.

The logical page numbered 4n+1 includes bytes 128 through 255 of the four physical pages numbered n.

The logical page numbered 4n+2 includes bytes 256 through 383 of the four physical pages numbered n.

The logical page numbered 4n+3 includes bytes 384 through 511 of the four pages numbered n.

Figure 5:
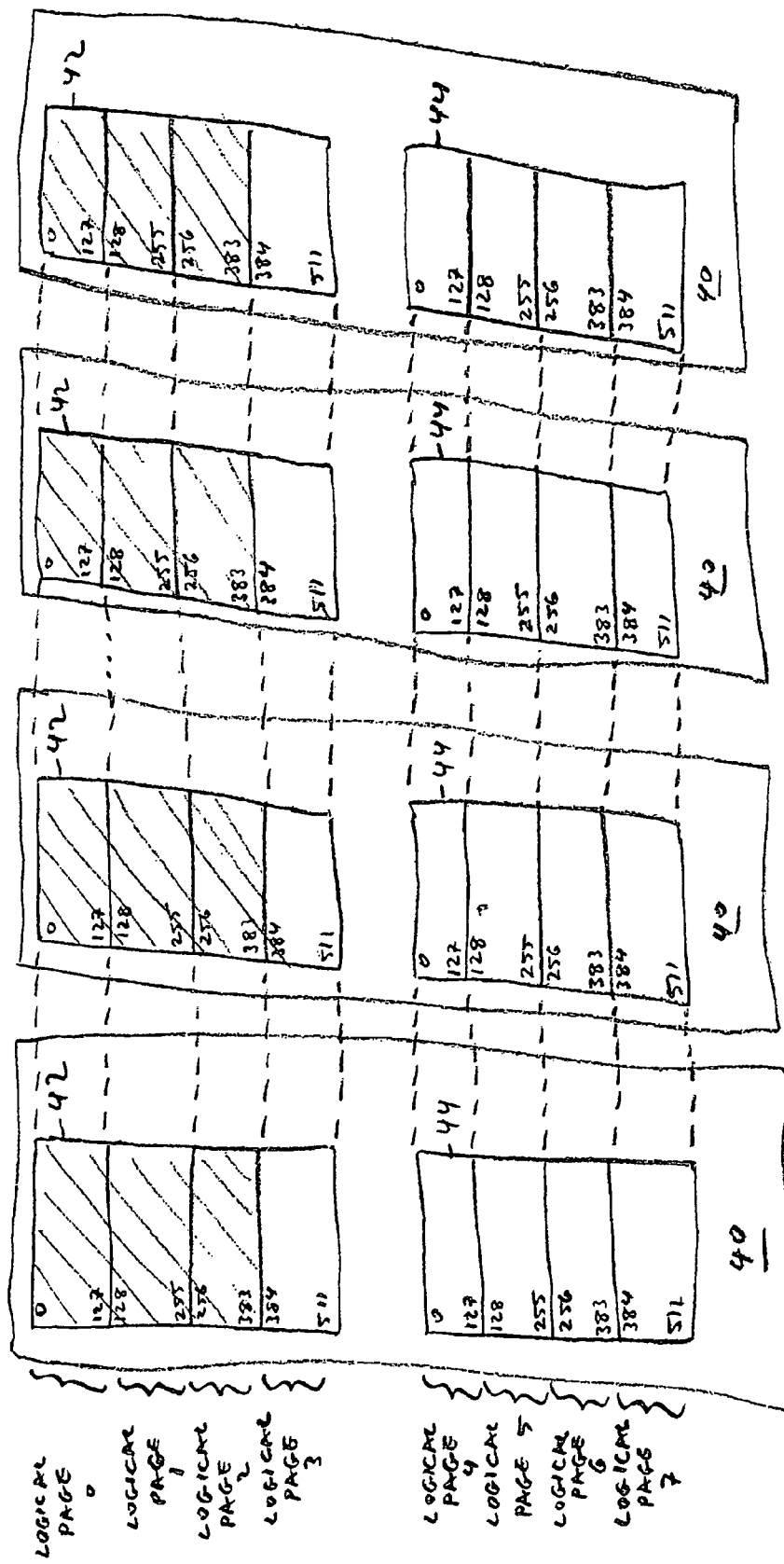
FIG. 5 shows an example of a risk zone in a prior art single-bit-cell flash memory architecture.
Figure 6:
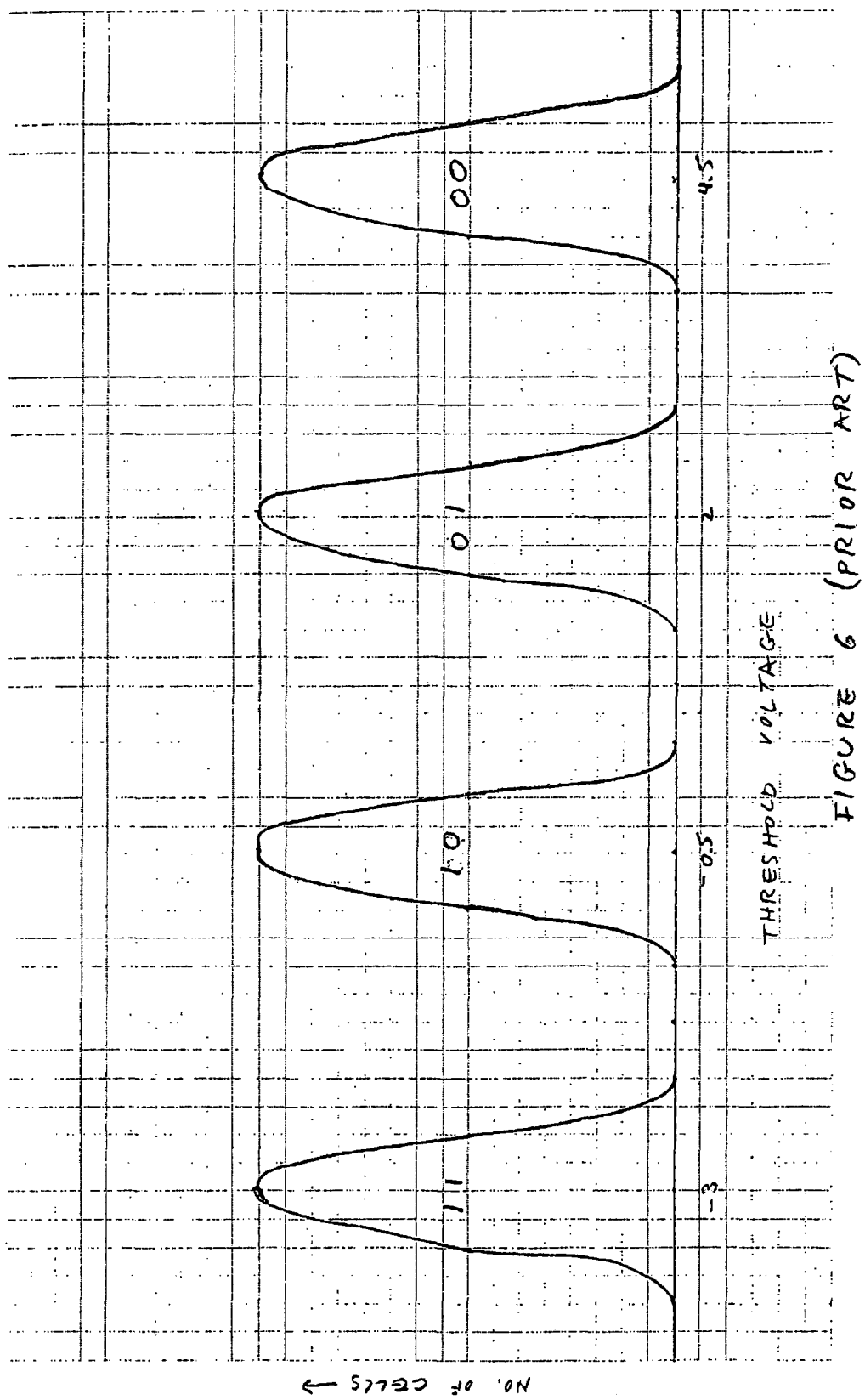
FIG. 6 is a histogram of threshold voltages in a prior art MLC flash memory.

So writing 512 bytes of data to logical page 0 actually distributes the data among (the first 128 bytes of) physical pages 0 of all four flash memories. Suppose that logical pages 0 and 1 have been written, and a power failure occurs during the writing of logical page 3. That power failure puts at risk the data written to logical pages 0 and 1. Therefore, the risk zone of logical page m is the other three logical pages between logical page m-(m modulo 4) and logical page m-(m modulo 4)+3. This is illustrated in FIG. 5 with respect to the writing of data to logical page 3. FIG. 5 shows four flash memories 40, each with 512-byte physical pages 42. The first two physical pages 42 and 44 of each flash memory 40 are shown as having four address zones: bytes 0 through 127, bytes 128 through 255, bytes 256-383 and bytes 384-511. Logical page 0 spans bytes 0 through 127 of all four physical page 42. Logical page 1 spans bytes 128 through 255 of all four physical pages 42. Logical page 2 spans bytes 256 through 383 of all four physical pages 42. Logical page 3 spans bytes 384 through 511 of all four physical pages 42. Logical page 4 spans bytes 0 through 127 of all four physical pages 44. Logical page 5 spans bytes 128 through 255 of all four physical pages 44. Logical page 6 spans bytes 256 through 383 of all four logical pages 44. Logical page 7 spans bytes 384 through 511 of all four physical pages 44. Logical pages 0-2 are shaded, as being the risk zone of logical page 3. Writing data to logical page 3 places data previously written to logical pages 0-2 at risk. Note that, in this example, each risk zone includes more pages than the example of FIG. 2: or three pages per risk zone rather than one.

It is not necessarily the case that the risk zone of a page is contiguous with that page. Consider for example a MLC device that uses multiple "planes" (also sometimes called "districts"). The Toshiba TC58DVG04B1FT00 is an example of such a device. In such a device the blocks and pages are grouped into separate planes, to enable the concurrent writing of several pages as long as no two of the pages are in the same plane. Referring again to the drawings, FIG. 3 is a schematic illustration of a block 30 of one such device, for which the flash management system has defined a logical-to-physical mapping in which the two pages 32 that share the same cells are four pages away from each other in logical address space, with page n in plane n modulo 4: page 0 is in plane 0, page 1 is in plane 1, page 2 is in plane 2, page 3 is in plane 3, page 4 is in plane 0, etc. This places page 4 physically adjacent to page 0, in the same physical superpage 34, so that pages 0 and 4, despite not being logically contiguous, share flash cells. It follows that the risk zone of page 0 is page 4 and the risk zone of page 4 is page 0.

Similarly, page 5 puts page 1 at risk, page 6 puts page 2 at risk and page 7 puts page 3 at risk. Because this scheme may be hard for a software developer to program for, simpler rules that are more conservative than what is optimally required may be used. For example, the eight pages 32 with addresses 0 through 7 can be considered as a group to which only one write command may be directed. If a first write command has written pages 0 through 2, then writing to pages 3 through 7 is forbidden. This actually is more restrictive than required: while pages 4, 5 and 6 should not be written because they would put pages 0 through 2 at risk, there is no reason not to write pages 3 and 7. Nevertheless, as long as the rule used is more restrictive than the required minimum, no harm is done, and the simplicity of an overly restrictive rule often more than compensates for its reduced efficiency.

FIG. 1A, in addition to illustrating a generic prior art flash-based data storage device 10, also serves to illustrate a flash-based data storage device 10 of the present invention, with the understanding that the flash management software stored in auxiliary non-volatile memory 18 and executed by controller 14 includes software for implementing the flash management method of the present invention to preclude corruption of data previously stored in the pages of NAND flash media 12 in case a write operation to NAND flash media 12 is interrupted by a power failure. The present invention allows the software application of the host system, be it a file management system or any other software application, to freely send write commands to such a device 10 of the present invention in any random order, and allows the software application to ignore the risk relations among the pages of NAND flash media 12. The method of the present invention provides full protection against power loss in the sense that the only pages that might be corrupted when a power loss interrupts a write command are the pages being written by the interrupted write command. All other pages are guaranteed to remain valid.

Figure 1B:
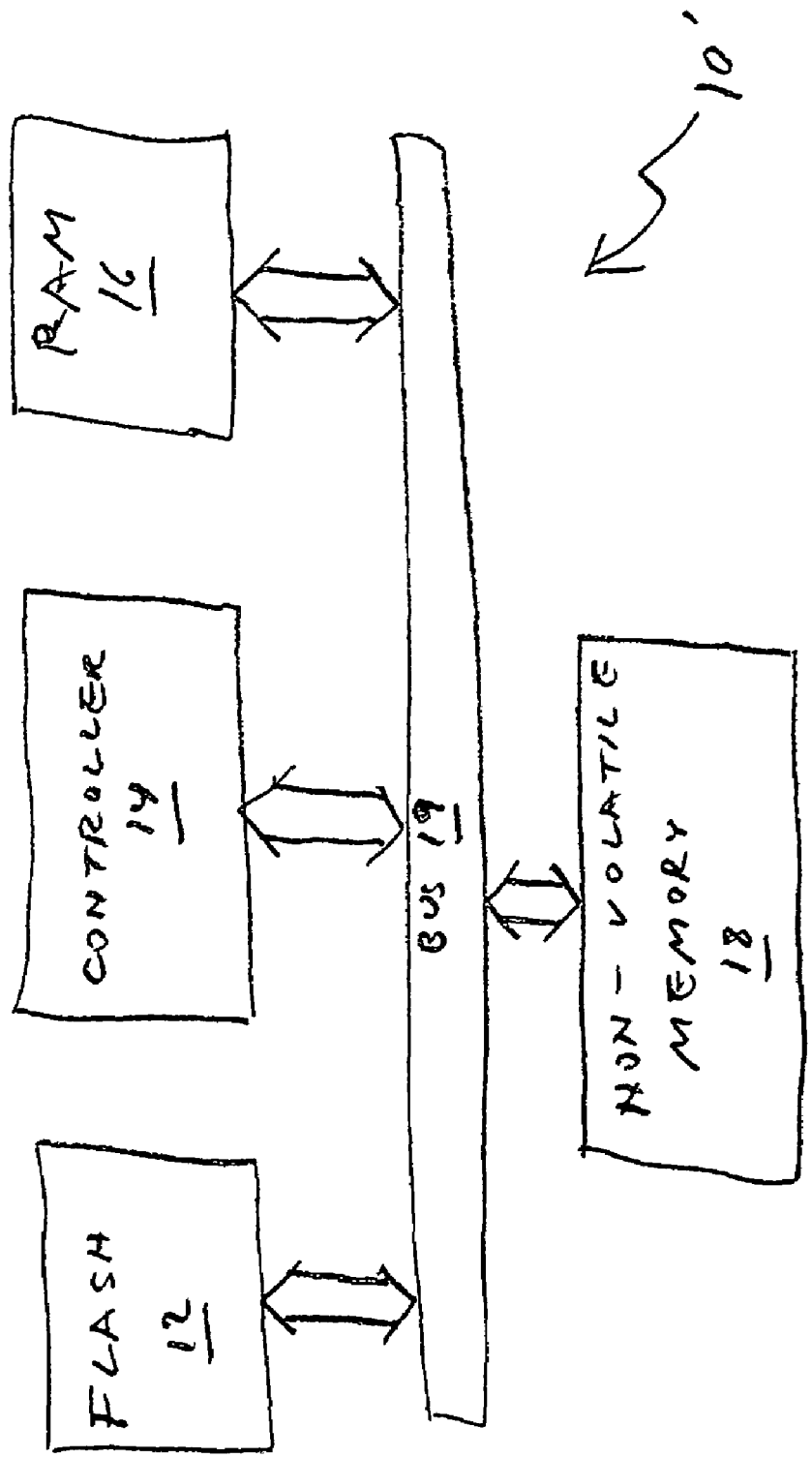

Similarly, FIG. 1B, in addition to illustrating a prior art personal computer 10', also illustrates a personal computer 10' of the present invention, with the understanding that the flash management software stored in auxiliary non-volatile memory 18 or in NAND flash media 12 as part of the operating system code of personal computer 10' and executed by controller 14 includes code for implementing the flash management method of the present invention to preclude corruption of data previously stored in the pages of NAND flash media 12 in case a write operation to NAND flash media 12 is interrupted by a power failure.

While the invention has been described with respect to a limited number of embodiments, it will be appreciated that many variations, modifications and other applications of the invention may be made.

What is claimed is:

1. A data storage system, comprising:
   (a) a data storage medium including a plurality of pages; and
   (b) a controller for writing new data to said plurality of pages in a manner that precludes corruption of old data stored in a first one of said plurality of pages, if writing said new data to a second one, of said plurality of pages, that shares at least one cell of said data storage medium with said first one of said plurality of pages, is interrupted.

2. The system of claim 1, wherein said data storage medium and said controller are operationally associated within a common housing.

3. The system of claim 1, wherein said data storage medium is operationally associated with said controller in a reversible manner.

4. The system of claim 1, wherein said data storage medium is non-volatile.

5. The system of claim 4, wherein said data storage medium is a flash memory.

6. The system of claim 5, wherein said flash memory includes a plurality of multi-level cells.

7. The system of claim 5, wherein said flash memory includes a plurality of blocks, such that each block of said plurality of blocks includes a respective subplurality of said plurality of pages, and wherein said controller writes said new data to said pages of each said block only sequentially.

8. The system of claim 5, wherein said flash memory includes a plurality of blocks, such that each block of said plurality of blocks, includes a respective subplurality of said plurality of pages, and wherein said controller writes said new data to said pages of each said block in a random order.

9. A computer readable storage medium having computer readable code embodied in said computer readable storage medium, the computer readable code for writing new data to at least one of a plurality of pages of a data storage medium in a manner that precludes corruption of old data stored in a first said page if writing said new data to a second said page, that shares at least one cell of the data storage medium with said first page, is interrupted.

10. A data storage system, comprising:
(a) a data storage medium including a plurality of physical pages; and
(b) a controller for:
   (i) accessing said data storage medium as a plurality of logical pages, with each said physical page spanning at least a portion of each of at least two said logical pages of said plurality of logical pages, and
   (ii) writing new data to said plurality of logical pages in a manner that precludes corruption of old data stored in a first one of said plurality of logical pages if writing said new data to a second one of said plurality of logical pages, that is spanned by at least one of said physical pages that also spans said first one of said plurality of logical pages, is interrupted.

11. A computer readable storage medium having computer readable code embodied in said computer readable storage medium, the computer readable code comprising:
(a) program code for accessing, as a plurality of logical pages, a data storage medium that includes a plurality of physical pages, with each said physical page spanning at least a portion of each of at least two said logical pages; and
(b) program code for writing new data to said plurality of logical pages in a manner tat precludes corruption of old data stored in a first one of said plurality of logical pages if writing said new data to a second one of said plurality of logical pages, that is spanned by at least one of said physical pages that also spans said first one of said plurality of logical pages, is interrupted.

12. The system of claim 1, wherein said manner that precludes said corruption of said old data includes retaining said old data in said first page if said writing of said new data is interrupted.

13. The computer readable storage medium of claim 9, wherein said manner that precludes said corruption of said old data includes retaining said old data in said first page if said writing of said new data is interrupted.

14. The system of claim 10, wherein said manner that precludes said corruption of said old data includes retaining said old data in said first logical page if said writing of said new data is interrupted.

15. The computer readable storage medium of claim 11, wherein said manner that precludes said corruption of said old data includes retaining said old data in said first logical page if said writing of said new data is interrupted.

* * * * *

UNITED STATES PATENT AND TRADEMARK OFFICE
CERTIFICATE OF CORRECTION

PATENT NO.       : 7,603,525 B2                                    Page 1 of 1
APPLICATION NO. : 11/159170
DATED            : October 13, 2009
INVENTOR(S)      : Menahem Lasser It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1074 days.

Signed and Sealed this

Fifth Day of October, 2010

David J. Kappos
*Director of the United States Patent and Trademark Office*